United States Patent
Kroening

(10) Patent No.: US 9,992,070 B2
(45) Date of Patent: Jun. 5, 2018

(54) SYSTEMS AND METHODS FOR A RECONFIGURABLE ORDER-CONSTRAINED SWITCH NETWORK

(71) Applicant: Honeywell International Inc., Morris Plains, NJ (US)

(72) Inventor: Adam M. Kroening, Atlanta, GA (US)

(73) Assignee: Honeywell International Inc., Morris Plains, NJ (US)

( * ) Notice: Subject to any disclaimer, the term of this patent is extended or adjusted under 35 U.S.C. 154(b) by 122 days.

(21) Appl. No.: 15/041,949

(22) Filed: Feb. 11, 2016

(65) Prior Publication Data
US 2017/0155555 A1 Jun. 1, 2017

Related U.S. Application Data

(60) Provisional application No. 62/261,717, filed on Dec. 1, 2015.

(51) Int. Cl.
| | |
|---|---|
| *H04L 12/751* | (2013.01) |
| *H04L 12/24* | (2006.01) |
| *H01P 5/12* | (2006.01) |
| *H03K 17/00* | (2006.01) |
| *H04B 1/18* | (2006.01) |

(52) U.S. Cl.
CPC ............... *H04L 41/12* (2013.01); *H01P 5/12* (2013.01); *H03K 17/00* (2013.01); *H04B 1/18* (2013.01)

(58) Field of Classification Search
CPC .. H01P 5/12; H03K 17/00; H04B 1/18; H04L 41/12
See application file for complete search history.

(56) References Cited

U.S. PATENT DOCUMENTS

| | | | | |
|---|---|---|---|---|
| 5,610,556 | A  * | 3/1997 | Rubin | H03F 3/602 |
| | | | | 330/124 D |
| 7,155,084 | B2 * | 12/2006 | Bortolini | G02B 6/29307 |
| | | | | 385/16 |
| 7,539,184 | B2 * | 5/2009 | Campini | H04L 41/00 |
| | | | | 370/388 |
| 8,941,446 | B2 | 1/2015 | Kroening | |
| 9,166,267 | B2 | 10/2015 | Kroening et al. | |
| 9,245,222 | B2 * | 1/2016 | Modha | G06N 3/04 |

(Continued)

OTHER PUBLICATIONS

European Patent Office, "Extended European Search Report from EP Application No. 16198057.8 dated Apr. 11, 2017", "from Foreign Counterpart of U.S. Appl. No. 15/041,949", filed Apr. 11, 2017, pp. 113, Published in: EP.

(Continued)

*Primary Examiner* — Brian D Nguyen
(74) *Attorney, Agent, or Firm* — Fogg & Powers LLC

(57) ABSTRACT

Systems and methods for a reconfigurable order-constrained switch network are provided. In certain implementations, a reconfigurable switch network comprises a plurality of subtrees, wherein a subtree comprises a plurality of ports coupled to a single port, wherein a signal that passes through the single port is directed to a port in the plurality of ports as directed by at least one circulator, wherein at least two subtrees in the plurality of subtrees have a different number of ports in the respective plurality of ports, wherein the plurality of subtrees are combined such that at least one of the plurality of ports from each subtree is shared.

20 Claims, 5 Drawing Sheets

(56) References Cited

U.S. PATENT DOCUMENTS

Figure 1A:
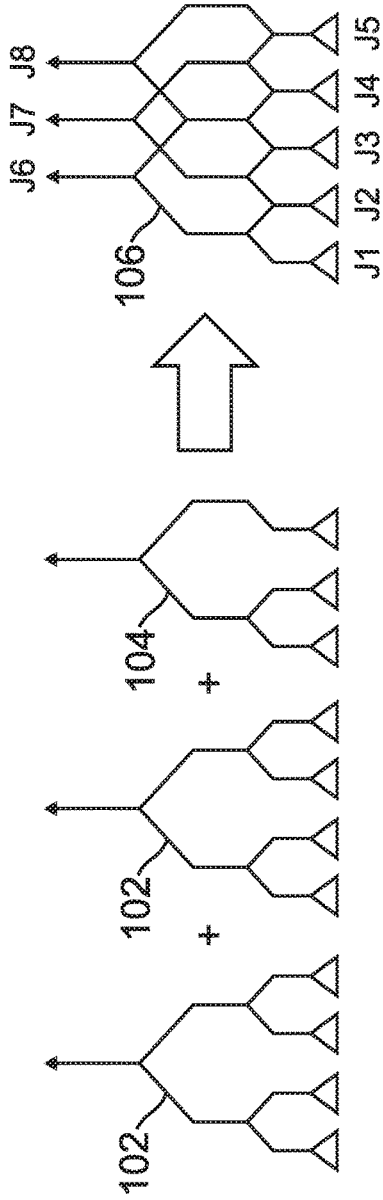

| | | | |
|---|---|---|---|
| 9,313,121 B2* | 4/2016 | Swinkels | H04L 45/50 |
| 9,460,012 B2* | 10/2016 | Pricopi | G06F 12/0813 |
| 9,472,837 B1* | 10/2016 | Kroening | H01P 1/383 |
| 2014/0320227 A1 | 10/2014 | Kroening et al. | |
| 2015/0115737 A1 | 4/2015 | Forney | |
| 2016/0013530 A1 | 1/2016 | Kroening | |

OTHER PUBLICATIONS

Eng et al., "Switch Matrix for TWTA Redundancy on Communication Satellites", "National Telecommunications Conference", Dec. 3-6, 1978, pp. 40.5.01-40.5.07.

Burrows, "Technical Report 639: Design of Microwave Beam-Switching Networks", Dec. 5, 1983, pp. 1-83, Publisher: Lincoln Laboratory, Massachusetts Institute of Technology.

\* cited by examiner

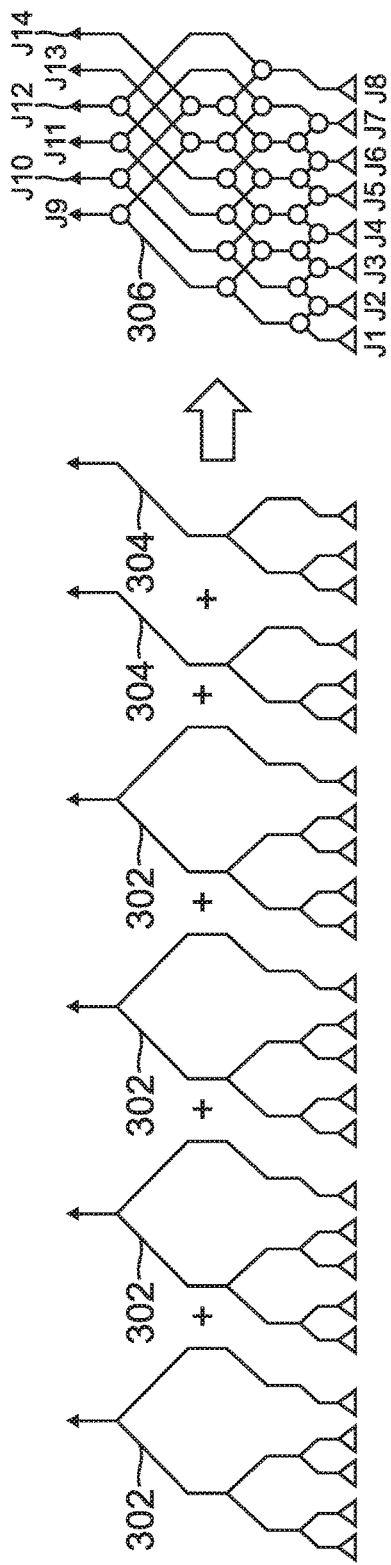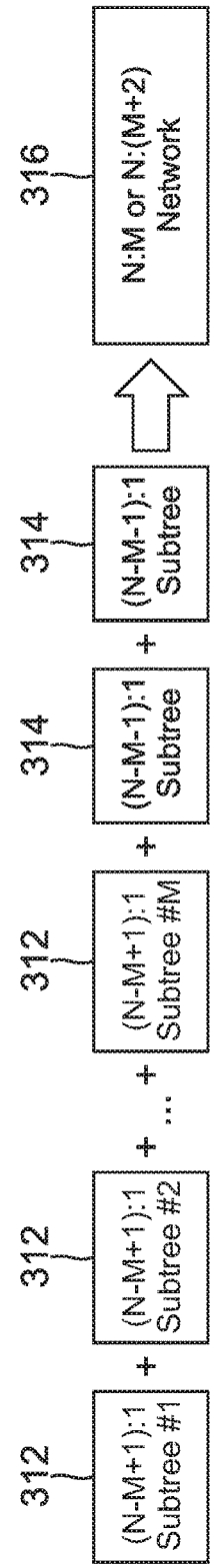
FIG. 3A
FIG. 3B

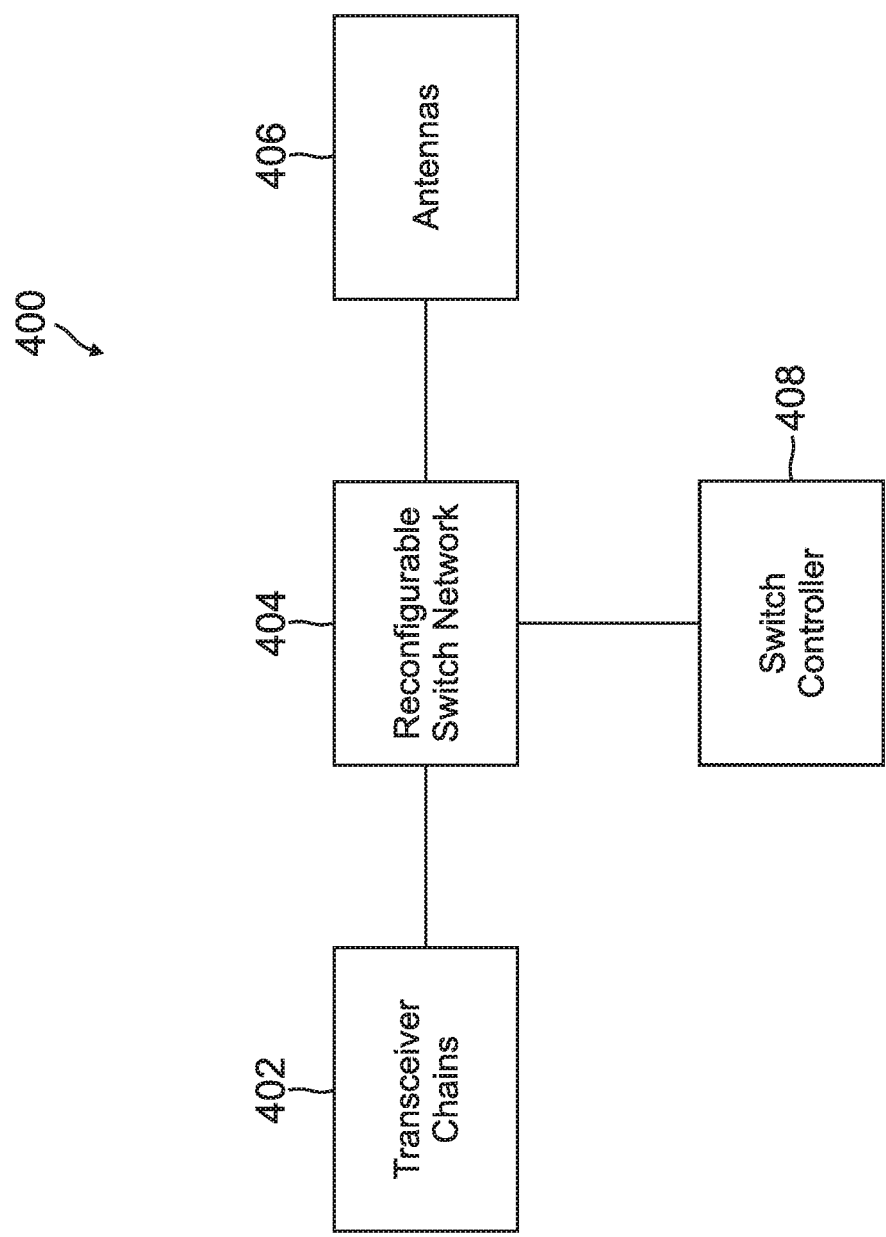

SYSTEMS AND METHODS FOR A RECONFIGURABLE ORDER-CONSTRAINED SWITCH NETWORK

CROSS REFERENCE TO RELATED APPLICATIONS

This application claims the benefit of U.S. Provisional Patent Application Ser. No. 62/261,717, filed on Dec. 1, 2015, which is hereby incorporated herein by reference.

BACKGROUND

Ferrite switch N-to-M (N:M) networks provide low loss connectivity from N input ports to M output ports, such as in a satellite application where N receive antenna feeds are multiplexed to connect to M receiver chains, where N is greater than M. This terminology will be used below for simplicity, but the N:M network could also operate in a transmit mode where M transmitter chains are multiplexed to N transmit antennas. Further, N:M networks may also be used in redundancy applications, such as where N:M standby redundant amplifiers are provided for M transmit or M receive chains. The N:M switch network can then be used to switch in one or more of the N–M standby amplifiers in case of a failure in one of the M active amplifiers.

In some applications of receive N:M switch networks, it is only critical that the M outputs can connect to any M of the N inputs; therefore, the mapping or the order in which the connections of the M outputs to the N inputs is made does not matter. This significantly reduces the permutations of connections needed and subsequently reduces the complexity of the N:M switch network required. The complex network that provides for all permutations of M to N mappings can be referred to as non-blocking. The simplified networks that are the topic of this invention can be referred to as blocking or order-constrained.

A 1983 technical report by M. L. Burrows titled, "Design of Microwave Beam-Switching Networks," describes an order constrained ferrite circulator switch network as the optimal circulator switch network approach for connecting N input ports to M output ports. The order constrained network provides the advantages of low insertion loss and parts count (parts=circulator switch junctions and switching electronics). The limiting factor in the order constrained network is that all N inputs cannot connect to all M outputs, so the network is not considered to be "non-blocking." N is greater than M for this example. The order constrained network does allow that any M of the N inputs can connect to the M outputs, but only in set mappings between the input and output ports.

SUMMARY

Systems and methods for a reconfigurable order-constrained switch network are provided. In certain implementations, a reconfigurable switch network comprises a plurality of subtrees, wherein a subtree comprises a plurality of ports coupled to a single port, wherein a signal that passes through the single port is directed to a port in the plurality of ports as directed by at least one circulator, wherein at least two subtrees in the plurality of subtrees have a different number of ports in the respective plurality of ports, wherein the plurality of subtrees are combined such that at least one of the plurality of ports from each subtree is shared.

DRAWINGS

Figure 1B:
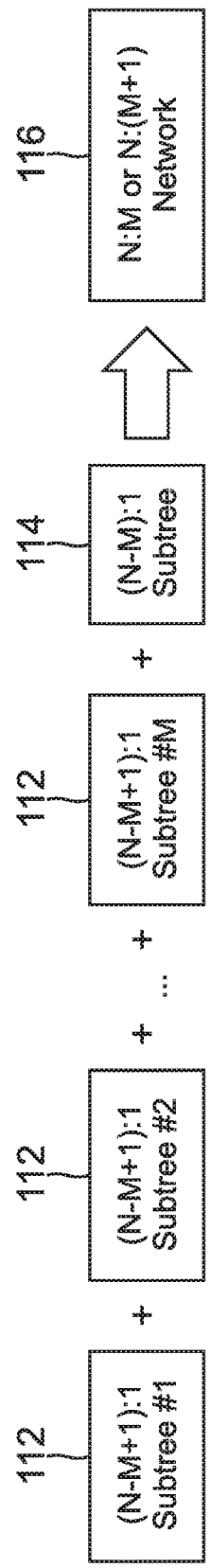
Figure 2A:
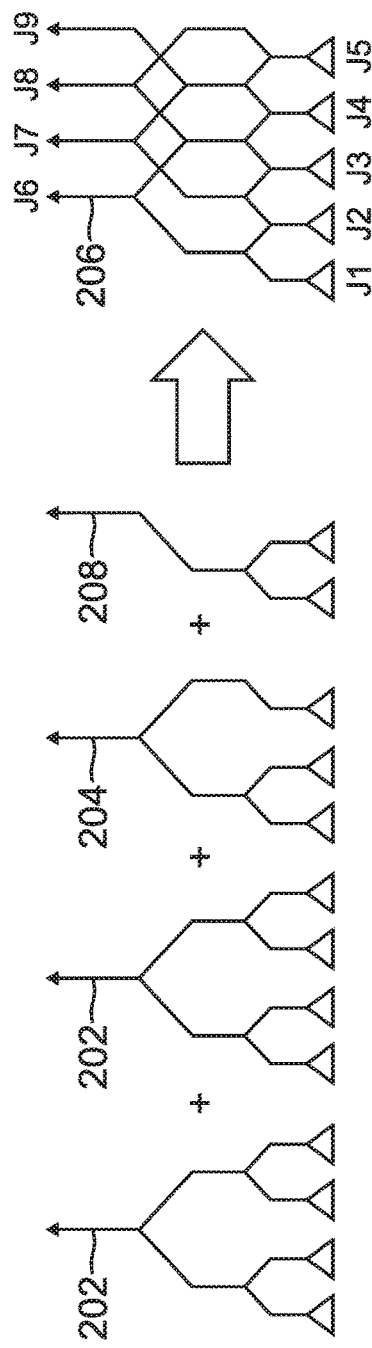
Figure 2B:
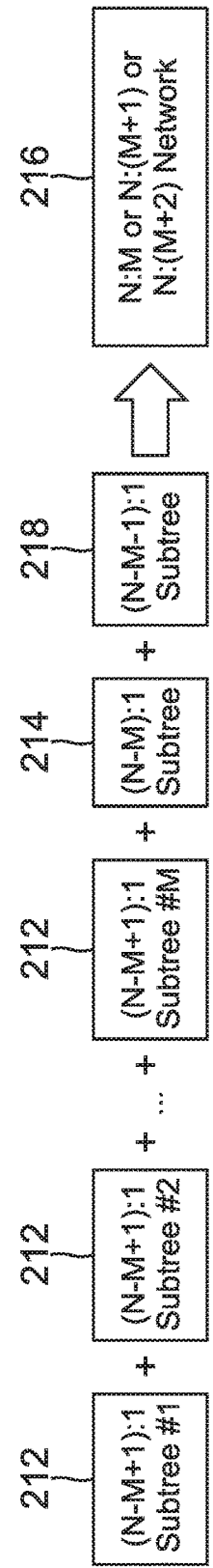
Figure 5:
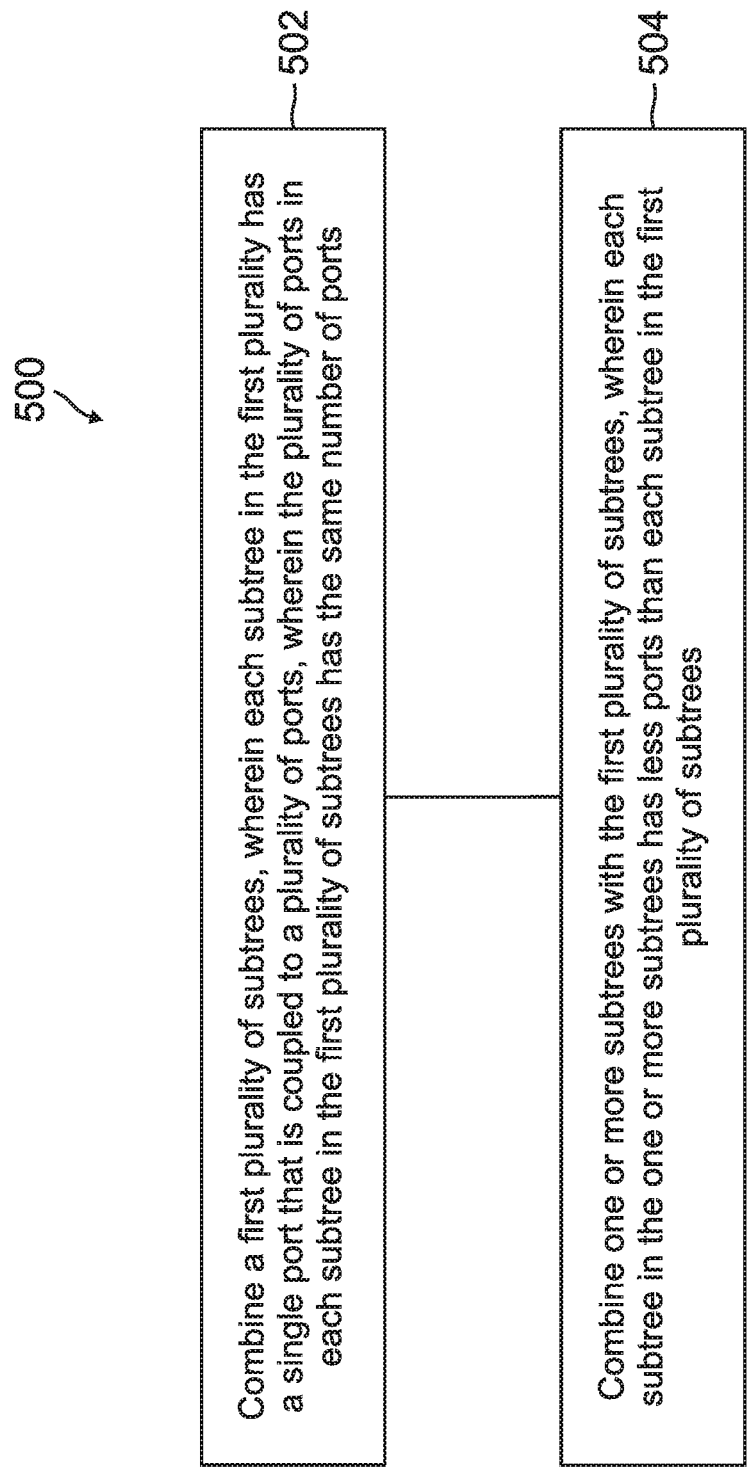

Understanding that the drawings depict only exemplary embodiments and are not therefore to be considered limiting in scope, the exemplary embodiments will be described with additional specificity and detail through the use of the accompanying drawings, in which:

FIG. 1A-1B are a series of diagrams illustrating reconfigurable switch networks in one embodiment described in the present disclosure FIGS. 2A-2B are a series of diagrams illustrating reconfigurable switch networks in one embodiment described in the present disclosure;

FIGS. 3A-3B area series of diagrams illustrating reconfigurable switch networks in one embodiment described in the present disclosure;

FIG. 4 is a block diagram illustrating a system implementing a reconfigurable switch network according to embodiments described in the present disclosure; and FIG. 5 is a flow diagram illustrating a method for fabricating a reconfigurable switch network described in the present disclosure.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

Systems and methods for a reconfigurable order-constrained switch network are provided. In certain implementations, a switch network is constructed by multiple order constrained subtrees that are variations of the trees described in the Burrows paper. In contrast to the switch networks described in the Burrows paper, at least one order constrained subtree is different from the other subtrees in the multiple order constrained subtrees. Due to the variation in order constrained subtrees in the multiple order constrained subtrees, the switch network is reconfigurable such that a single order-constrained network may be used for multiple combinations of N inputs and M outputs.

FIG. 1A illustrates the formation of a reconfigurable order constrained switch network 106 from multiple order-constrained subtrees. In certain implementations, the reconfigurable switch network 106 may be a 5:3 switch network. As illustrated, the switch network 106 is fabricated from the combination of three order constrained switching subtrees. The three order constrained switching subtrees that are used to fabricate the reconfigurable switch network 106 include two 4:1 subtrees 102 and a single 3:1 subtree 104. The different subtrees 102 and 104 are combined using circulators wherever three line segments intersect in switch network 106. As illustrated, the output J6 can be configured to connect to any of input antennas J1-J4; the output J7 can be configured to connect to any of input antennas J2-J5; and the output J8 can be configured to connect to any of input antennas J3-J5. As such, any combination of three of the input antennas may be connected to the three outputs J6-J8. As used herein, the terms "input" and "output" are used to designate ports from one another and does not imply that an input is only capable of receiving signals nor does it imply that signals are always transmitted from an output. Rather, the terms "input" and "output" imply that if a signal is received through an input, then the signal will be transmitted from an output. Likewise, if a signal is received through an output, then the signal will be transmitted from an input.

In certain embodiments, the switch network 106 may be reconfigured into a 5:2 switch network. For example, a load may be coupled to the J8 output. As the load is now coupled to the J8 output, there are only two outputs J6 and J7. Like the outputs for the 5:3 switch network, the output J6 can be configured to connect to any of input antennas J1-J4 and the output J7 can be configured to connect to any of input antennas J2-J5. Accordingly, any combination of two of the input antennas may be connected to the two outputs J6-J7. Thus, the switch network 106 is capable of functioning as a 5:3 switch network or a 5:2 network.

FIG. 1B illustrates a block diagram for a general implementation for forming a reconfigurable switch network 116. As illustrated, an N:M switch network 116 that can be reconfigured into an N:(M+1) is comprised of M (N−M+1):1 subtrees 112 and a single (N−M):1 subtree 114. For example, as described above, in relation to FIG. 1A, in switch network 106, N=5 and M=2. Thus, N−M+1=4, therefore, the switch network 106 comprises two 4:1 subtrees 102 and one 3:1 subtree, which combine to form either a 5:2 network or a 5:3 network. Other reconfigurable switch networks may also be fabricated based on the general description provided in FIG. 1B.

FIG. 2A illustrates the formation of a reconfigurable order constrained switch network 206 from multiple order-constrained subtrees. In certain implementations, the reconfigurable switch network 206 may be capable of being a 5:4 switch network. As illustrated, the switch network 206 is fabricated from the combination of four order constrained switching subtrees. The four order constrained switching subtrees that are used to fabricate the reconfigurable switch network 206 include two 4:1 subtrees 202, a single 3:1 subtree 204, and a single 2:1 subtree 208. The different subtrees 202, 204 and 208 are combined using circulators wherever three line segments intersect in switch network 206. Further, a 2:1 subtree may be fabricated to be smaller than illustrated in regards to subtree 208, however, the shape of the 2:1 subtree or any subtrees having a smaller number of inputs may be fabricated to have a similar shape to the subtree having the largest number of inputs. In a further example, as illustrated, the output J6 can be configured to connect to any of input antennas J1-J4; the output J7 can be configured to connect to any of input antennas J2-J5; the output J8 can be configured to connect to any of input antennas J345; and the output J9 can be configured to connect to any of input antennas J4-J5. As such, any combination of three of the input antennas may be connected to the three outputs J6-J8.

In certain embodiments, the switch network 206 may be reconfigured into either a 5:3 or a 5:2 switch network. For example, to configure the switch network 206 into a 5:3 switch network a load may be coupled to the J9 output. As the load is now coupled to the J9 output, there are three outputs J6, J7, and J8. Like the outputs for the 5:4 switch network, the output J6 may be configured to connect to any of input antennas J1-J4; the output J7 may be configured to connect to any of input antennas J2-J5; and the output J8 may be configured to connect to any of input antennas J3-J5. Accordingly, any combination of three of the input antennas may be connected to the three outputs J6-J8. Further, to configure the switch network 206 into a 5:2 switch network a load may be coupled to the J8 and the J9 outputs. As the load is now coupled to the J8 and the J9 outputs, there are two outputs J6 and J7. Like the outputs for the 5:4 switch network, the output J6 may be configured to connect to any of input antennas J1-J4 and the output J7 may be configured to connect to any of input antennas J2-J5. Accordingly, any combination of two of the input antennas may be connected to the two outputs J6-J7 Thus, the switch network 206 is capable of functioning as a 5:4, switch network, 5:3 switch network, or a 5:2 switch network.

FIG. 2B illustrates a block diagram for a general implementation for geometrically forming a reconfigurable switch network 216. As illustrated, an N:M switch network 216 that can be reconfigured into an N:(M+1) or N:(M+2) switch network may be comprised of M (N−M+1):1 subtrees 212, a single (N−M):1 subtree 214, and a single (N−M−1):1 subtree 218. For example, as described above, in relation to FIG. 2A, in switch network 206, N=5 and M=2. Thus, N−M+1=4, thus switch network 206 comprises two 4:1 subtrees 202, one 3:1 subtree, and one 2:1 subtree which combine to form either a 5:2 network, a 5:3 network, or a 5:4 network. Other reconfigurable switch networks may also be fabricated based on the general description provided in FIG. 2B.

FIG. 3A illustrates the formation of a reconfigurable order constrained switch network 306 from multiple order-constrained subtrees. In certain implementations, the reconfigurable switch network 306 may be capable of being either an 8:6 switch network or an 8:4 switch network. As illustrated, the switch network 206 is fabricated from the combination of six order constrained switching subtrees. The six order constrained switching subtrees that are used to fabricate the reconfigurable switch network 306 include four 5:1 subtrees 302 and two 3:1 subtrees 304. The different subtrees 302 and 304 are combined using circulators wherever three line segments intersect in switch network 306. Further, a 3:1 subtree may be fabricated to be smaller than illustrated in regards to subtree 304, however, the shape of the 3:1 subtree or any subtrees having a smaller number of inputs when compared to the subtree having the largest number of inputs may be fabricated to have a similar shape to the subtree having the largest number of inputs. For example, the 3:1 subtree 304 may have a shape similar to the 5:1 subtree 302 save only two of the inputs are removed. Further, as illustrated, the output J9 can be configured to connect to any of input antennas J1-J7; the output J10 can be configured to connect to any of input antennas J2-J8; the output J11 can be configured to connect to any of input antennas J3-J7; the output J12 can be configured to connect to any of input antennas J4-J8; the output J13 can be configured to connect to any of input antennas J5-J7; and the output J14 can be configured to connect to any of input antennas J6-J8. As such, any combination of six of the input antennas may be connected to the six outputs J9-J14.

In certain embodiments, the 8:6 switch network 306 may be reconfigured into either an 8:4 or an 8:2 switch network. For example, to reconfigure the switch network 306 into an 8:4 switch network a load may be coupled to both the J13 and J14 outputs. As the load is now coupled to the J13 and J14 outputs, there are four outputs J9-J12. Like the outputs for the 8:6 switch network, the output J9 can be configured to connect to any of input antennas J1-J7; the output J10 can be configured to connect to any of input antennas J2-J8; the output J11 can be configured to connect to any of input antennas J3-J7; and the output J12 can be configured to connect to any of input antennas J4-J8. Accordingly, any combination of four of the input antennas may be connected to the four outputs J9-J12. Further, to reconfigure the switch network 306 into an 8:2 switch network a load may be coupled to the J11-J14 outputs. As the load is now coupled to the J11-J14 outputs, there are two outputs J9 and J10. Like the outputs for the 8:6 switch network, the output J9 can be configured to connect to any of input antennas J1-J7 and the output J10 can be configured to connect to any of input antennas J2-J8. Accordingly, any combination of two of the input antennas may be connected to the two outputs J9 and J10 Thus, the switch network 206 is capable of functioning as an 8:6 switch network, an 8:4 switch network, or an 8:2 switch network.

FIG. 3B illustrates a block diagram for a general implementation for geometrically forming a reconfigurable switch network 316. As illustrated, an N:M switch network 316 that can be reconfigured into an N:(M+2) switch network (and in at least the example illustrated above, an N:(M−2) switch network) may be comprised of M (N−M+1):1 subtrees 312 and two (N−M−1):1 subtrees 314. For example, as described above, in relation to FIG. 2A, in switch network 306, N=8 and M=4. Thus, N−M+1=5, thus switch network 306 comprises four 5:1 subtrees 302 and two 3:1 subtrees which combine to form either an 8:6 network and an 8:4 network. Other reconfigurable switch networks may also be fabricated based on the general description provided in FIG. 3B.

For the above examples, the port count held constant was N, where N>M and M is varied for the different options instead of being set to a constant as disclosed in the Burrows paper. Either N or M could be considered the input or output side of the switch matrix.

FIG. 4 is a block diagram of a system 400 that utilizes a reconfigurable switch network 400 to communicate between transceiver chains 402 and antennas 406, such as is described above in relation to FIGS. 1A-3B. As illustrated, the reconfigurable switch network 404 is coupled to multiple transceiver chains 402 and to multiple antennas 406. The transceiver chains 402 include electrical components that are capable of transmitting a signal through the reconfigurable switch network 404 to be emitted by the antennas 406. Also, the transceiver chains 402 are capable of receiving and processing a signal that was received through the antennas 406 and the reconfigurable switch network 404. In at least one implementation, the transceiver chains 402 include components like low noise amplifiers, processors, modulators, among other components known to one having skill in the art. In at least one implementation, when a component fails in a particular transceiver chain, the reconfigurable switch network 404 may be reconfigured by a switch controller 408 such that the failed component is switched for a working component.

FIG. 5 is a flow diagram illustrating a method 500 for fabricating a reconfigurable switch network. Method 500 proceeds at 502, where a first plurality of subtrees is combined, wherein each subtree in the first plurality has a single port that is coupled to a plurality of ports, wherein the plurality of ports in each subtree in the first plurality of subtrees has the same number of ports. Further, method 500 proceeds at 504, where one or more subtrees are combined with the first plurality of subtrees, wherein each subtree in the one or more subtrees has less ports than each subtree in the first plurality of subtrees. As illustrated above, by combining subtrees having different numbers of ports, the combined subtrees form a reconfigurable switch network.

EXAMPLE EMBODIMENTS

Example 1 includes a reconfigurable switch network, the switch network comprising: a plurality of subtrees, wherein a subtree comprises a plurality of ports coupled to a single port, wherein a signal that passes through the single port is directed to a port in the plurality of ports as directed by at least one circulator, wherein at least two subtrees in the plurality of subtrees have a different number of ports in the respective plurality of ports; wherein the plurality of subtrees are combined such that at least one of the plurality of ports from each subtree is shared.

Example 2 includes the reconfigurable switch network of Example 1, wherein the plurality of subtrees comprises N−M different subtrees that are combined such that the switch network can be reconfigured to have one of M and M+1 outputs.

Example 3 includes the reconfigurable switch network of Example 2, wherein the switch network comprises: M different subtrees, each of the M different subtrees having one output port and N−M+1 input ports; and an altered subtree, wherein the altered subtree has N−M input ports and one output port.

Example 4 includes the reconfigurable switch network of any of Examples 1-3, wherein the plurality of subtrees comprises N−M+1 different subtrees that are combined such that the switch network can be reconfigured to have one of M, M+1, and M+2 outputs.

Example 5 includes the reconfigurable switch network of Example 4, wherein the switch network comprises: M different subtrees, each of the M different subtrees having one output port and N−M+1 input ports; a first altered subtree, wherein the first altered subtree has N−M input ports and one output port; and a second altered subtree, wherein the second altered subtree has N−M−1 input ports and one output port.

Example 6 includes the reconfigurable switch network of any of Examples 1-5, wherein the plurality of subtrees comprises N−M+2 different subtrees that are combined such that the switch network can be reconfigured to have one of M+2 and M outputs.

Example 7 includes the reconfigurable switch network of Example 6, wherein the plurality of subtrees comprise: M different subtrees, each of the M different subtrees having one output port and N−M+1 input ports; and two altered subtrees, each of the two altered subtrees has N−M−1 input ports and one output port.

Example 8 includes the reconfigurable switch network of any of Examples 1-7, wherein the at least two subtrees have the same shape for the shared at least one of the plurality of ports.

Example 9 includes a method for fabricating a reconfigurable switch network, the method comprising: combine a plurality of subtrees, wherein each subtree in the plurality has a single port that is coupled to a plurality of ports, wherein the plurality of ports in each subtree in the plurality of subtrees has the same number of ports, wherein the plurality of ports for a respective subtree in the plurality of subtrees partially overlap with a portion of the plurality of ports for the other respective subtrees in the plurality of subtrees; combine one or more subtrees with the plurality of subtrees, wherein each subtree in the one or more subtrees has less ports than each subtree in the plurality of subtrees, wherein the ports of the one or more subtrees overlap with ports in the plurality of subtrees.

Example 10 includes the method of Example 9, wherein the plurality of subtrees combined with the one or more subtrees comprise N−M different subtrees that are combined such that the reconfigurable switch network can be reconfigured to have one of M and M+1 outputs.

Example 11 includes the method of Example 10, wherein: the plurality of subtrees comprises M different subtrees, each of the M different subtrees having one output port and N−M+1 input ports; and the one or more subtrees comprise an altered subtree that has N−M input ports and one output port.

Example 12 includes the method of any of Examples 9-11, wherein the plurality of subtrees combined with the one or more subtrees comprise N−M+1 different subtrees that are combined such that the reconfigurable switch network can be reconfigured to have one of M, M+1, and M+2 outputs.

Example 13 includes the method of Example 12, wherein: the plurality of subtrees comprises M different subtrees, each of the M different subtrees having one output port and N−M+1 input ports; and the one or more subtrees comprise: a first altered subtree, the first altered subtree having N−M input ports and one output port; and a second altered subtree, the second altered subtree having N−M−1 input ports and one output port.

Example 14 includes the method of any of Examples 9-13, wherein the plurality of subtrees comprises N−M+2 different subtrees that are combined such that the switch network can be reconfigured to have one of M+2 and M outputs.

Example 15 includes the method of Example 14, wherein: the plurality of subtrees comprises M different subtrees, each of the M different subtrees having one output port and N−M+1 input ports; and the one or more subtrees comprise two altered subtrees, each of the two altered subtrees having N−M−1 input ports and one output port.

Example 16 includes the method of any of Examples 9-15, wherein the one or more subtrees and the plurality of subtrees have the same shape for shared ports.

Example 17 includes a system, the system comprising: a plurality of antennas; a reconfigurable switch network, the reconfigurable switch network comprising: a plurality of subtrees, wherein a subtree comprises a plurality of ports coupled to a single port, each port in the plurality of ports coupled to an antenna in the plurality of antennas, wherein signals are communicated between the single port and a port in the plurality of ports as directed by at least one circulator, wherein at least two subtrees in the plurality of subtrees have a different number of ports in the respective plurality of ports; wherein the plurality of subtrees are combined such that at least one of the plurality of ports from each subtree is shared.

Example 18 includes the system of Example 17, wherein the plurality of subtrees comprises N−M different subtrees that are combined such that the switch network can be reconfigured to have one of M and M+1 outputs.

Example 19 includes the system of any of Examples 17-18, wherein the plurality of subtrees comprises N−M+1 different subtrees that are combined such that the switch network can be reconfigured to have one of M, M+1, and M+2 outputs.

Example 20 includes the system of any of Examples 17-19, wherein the plurality of subtrees comprises N−M+2 different subtrees that are combined such that the switch network can be reconfigured to have one of M+2 and M outputs.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

The invention claimed is:

1. A reconfigurable switch network, the switch network comprising:
a plurality of subtrees, wherein a subtree comprises a plurality of ports coupled to a single port, wherein a signal that passes through the single port is directed to a port in the plurality of ports as directed by at least one circulator, wherein at least two subtrees in the plurality of subtrees have a different number of ports in the respective plurality of ports;
wherein the plurality of subtrees are combined such that each subtree in the plurality of subtrees overlaps with at least one other subtree in the plurality of subtrees and at least one of the plurality of ports from each subtree is shared with at least one port from at least one other subtree in the plurality of subtrees.

2. The reconfigurable switch network of claim 1, wherein the plurality of subtrees comprises N−M subtrees that are combined such that the switch network is configured to have one of M and M+1 outputs, wherein N represents a combined plurality of ports for the combined plurality of subtrees and M represents the number of outputs of the reconfigurable switch network.

3. The reconfigurable switch network of claim 2, wherein N−M subtrees comprise:
M subtrees, each of the M subtrees having one output port and N−M+1 input ports; and
an altered subtree, wherein the altered subtree has N−M input ports and one output port.

4. The reconfigurable switch network of claim 1, wherein the plurality of subtrees comprises N−M+1 subtrees that are combined such that the switch network is configured to have one of M, M+1, and M+2 outputs, wherein N represents a combined plurality of ports for the combined plurality of subtrees and M represents the number of outputs of the reconfigurable switch network.

5. The reconfigurable switch network of claim 4, wherein N−M+1 subtrees comprise:
M subtrees, each of the M subtrees having one output port and N−M+1 input ports;
a first altered subtree, wherein the first altered subtree has N−M input ports and one output port; and
a second altered subtree, wherein the second altered subtree has N−M−1 input ports and one output port.

6. The reconfigurable switch network of claim 1, wherein the plurality of subtrees comprises N−M+2 subtrees that are combined such that the switch network is configured to have one of M+2 and M outputs, wherein N represents a combined plurality of ports for the combined plurality of subtrees and M represents the number of outputs of the reconfigurable switch network.

7. The reconfigurable switch network of claim 6, wherein the plurality of subtrees comprise:
M subtrees, each of the M subtrees having one output port and N−M+1 input ports; and
two altered subtrees, each of the two altered subtrees has N−M−1 input ports and one output port.

8. The reconfigurable switch network of claim 1, wherein the at least two subtrees have the same shape for the shared at least one of the plurality of ports.

9. A method for fabricating a reconfigurable switch network, the method comprising:
combine a plurality of subtrees, wherein each subtree in the plurality has a single port that is coupled to a plurality of ports, wherein the plurality of ports in each subtree in the plurality of subtrees has the same number of ports;

combine one or more altered subtrees with the plurality of subtrees, wherein each subtree in the one or more altered subtrees has less ports than each subtree in the plurality of subtrees, wherein each of the plurality of subtrees and the one or more altered subtrees overlap with at least one of: an other subtree in the plurality of subtrees or an other altered subtree.

10. The method of claim 9, wherein the plurality of subtrees combined with the one or more altered subtrees comprise N−M subtrees that are combined such that the reconfigurable switch network is configured to have one of M and M+1 outputs, wherein N represents a combined plurality of ports for the combined plurality of subtrees and M represents the number of outputs of the reconfigurable switch network.

11. The method of claim 10, wherein:
the plurality of subtrees comprises M subtrees, each of the M subtrees having one output port and N−M+1 input ports; and
the one or more altered subtrees comprise an altered subtree that has N−M input ports and one output port.

12. The method of claim 9, wherein the plurality of subtrees combined with the one or more altered subtrees comprise N−M+1 subtrees that are combined such that the reconfigurable switch network is configured to have one of M, M+1, and M+2 outputs, wherein N represents a combined plurality of ports for the combined plurality of subtrees and M represents the number of outputs of the reconfigurable switch network.

13. The method of claim 12, wherein:
the plurality of subtrees comprises M subtrees, each of the M subtrees having one output port and N−M+1 input ports; and
the one or more altered subtrees comprise:
a first altered subtree, the first altered subtree having N−M input ports and one output port; and
a second altered subtree, the second altered subtree having N−M−1 input ports and one output port.

14. The method of claim 9, wherein the plurality of subtrees comprises N−M+2 subtrees that are combined such that the switch network is configured to have one of M+2 and M outputs, wherein N represents the combined plurality of ports for a combined plurality of subtrees and M represents the number of outputs of the reconfigurable switch network.

15. The method of claim 14, wherein:
the plurality of subtrees comprises M subtrees, each of the M subtrees having one output port and N−M+1 input ports; and
the one or more altered subtrees comprise two altered subtrees, each of the two altered subtrees having N−M−1 input ports and one output port.

16. The method of claim 9, wherein the one or more altered subtrees and the plurality of subtrees have the same shape for shared ports.

17. A system, the system comprising:
a plurality of antennas;
a reconfigurable switch network, the reconfigurable switch network comprising:
a plurality of subtrees, wherein a subtree comprises a plurality of ports coupled to a single port, each port in the plurality of ports coupled to an antenna in the plurality of antennas, wherein signals are communicated between the single port and a port in the plurality of ports as directed by at least one circulator, wherein at least two subtrees in the plurality of subtrees have a different number of ports in the respective plurality of ports;
wherein the plurality of subtrees are combined such that each subtree in the plurality of subtrees overlaps with at least one other subtree in the plurality of subtrees and at least one of the plurality of ports from each subtree is shared with at least one port from at least one other subtree in the plurality of subtrees.

18. The system of claim 17, wherein the plurality of subtrees comprises N−M subtrees that are combined such that the switch network is configured to have one of M and M+1 outputs, wherein N represents a combined plurality of ports for the combined plurality of subtrees and M represents the number of outputs of the reconfigurable switch network.

19. The system of claim 17, wherein the plurality of subtrees comprises N−M+1 subtrees that are combined such that the switch network is configured to have one of M, M+1, and M+2 outputs, wherein N represents a combined plurality of ports for the combined plurality of subtrees and M represents the number of outputs of the reconfigurable switch network.

20. The system of claim 17, wherein the plurality of subtrees comprises N−M+2 subtrees that are combined such that the switch network is configured to have one of M+2 and M outputs, wherein N represents a combined plurality of ports for the combined plurality of subtrees and M represents the number of outputs of the reconfigurable switch network.

* * * * *